United States Patent
Bae et al.

(10) Patent No.: US 8,368,107 B2
(45) Date of Patent: Feb. 5, 2013

(54) LIGHT EMITTING DEVICE, METHOD OF MANUFACTURING THE SAME, AND LIGHT EMITTING DEVICE PACKAGE

(75) Inventors: Jung Hyeok Bae, Seoul (KR); Young Kyu Jeong, Seoul (KR); Kyung Wook Park, Seoul (KR); Duk Hyun Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 108 days.

(21) Appl. No.: 12/971,945

(22) Filed: Dec. 17, 2010

(65) Prior Publication Data

US 2011/0175124 A1 Jul. 21, 2011

(30) Foreign Application Priority Data

Jan. 15, 2010 (KR) .......................... 10-2010-0004101

(51) Int. Cl.
*H01L 33/00* (2010.01)

(52) U.S. Cl. ........................................................ 257/98

(58) Field of Classification Search ................ 257/98, 257/E33.067
See application file for complete search history.

(56) References Cited

U.S. PATENT DOCUMENTS

| | | | |
|---|---|---|---|
| 6,049,124 A * | 4/2000 | Raiser et al. | 257/712 |
| 6,744,071 B2 * | 6/2004 | Sano et al. | 257/79 |
| 2003/0141506 A1 | 7/2003 | Sano et al. | |
| 2006/0193355 A1 | 8/2006 | Tazima et al. | |
| 2006/0249736 A1 | 11/2006 | Lee et al. | |
| 2008/0048202 A1 | 2/2008 | Tazima et al. | |
| 2008/0251808 A1 * | 10/2008 | Kususe et al. | 257/98 |
| 2009/0166608 A1 * | 7/2009 | Nakanishi et al. | 257/13 |
| 2009/0261370 A1 | 10/2009 | Jeong | |
| 2010/0065872 A1 | 3/2010 | Lee | |

FOREIGN PATENT DOCUMENTS

| | | |
|---|---|---|
| EP | 2 262 011 A | 12/2008 |
| KR | 10-2007-0058713 A | 6/2007 |
| KR | 10-0872717 B1 | 12/2008 |
| KR | 10-2009-0104931 A | 10/2009 |
| KR | 10-2009-0111225 A | 10/2009 |

* cited by examiner

*Primary Examiner* — Shaun Campbell
(74) *Attorney, Agent, or Firm* — Birch, Stewart, Kolasch & Birch, LLP

(57) ABSTRACT

A light emitting device according to the embodiment includes a conductive support member having a step portion at an outer peripheral region thereof, a protective member for filling the step portion formed at the outer peripheral region of the conductive support member, a reflective layer over the conductive support member, and a light emitting structure over the reflective layer and the protective member.

20 Claims, 11 Drawing Sheets

100B

100C

LIGHT EMITTING DEVICE, METHOD OF MANUFACTURING THE SAME, AND LIGHT EMITTING DEVICE PACKAGE

BACKGROUND

The embodiment relates to a light emitting device, a light emitting device package and a method of manufacturing the light emitting device.

A light emitting diode (LED) is a semiconductor light emitting device that converts current into light. Recently, the brightness of the LED is increased, so that the LED has been employed as a light source for a display device, a vehicle, or a lighting device. In addition, the LED can represent a white color having superior light efficiency by employing luminescence materials or combining LEDs having various colors.

Meanwhile, the LED manufacturing process requires high precision, and the reliability and high product yield are very important in the LED manufacturing process. In this regard, various studies and research have been performed to ensure the reliability of the LED manufacturing process.

SUMMARY

The embodiment provides a light emitting device capable of improving the reliability, a light emitting device package, and a method of manufacturing the light emitting device.

A light emitting device according to the embodiment may include a conductive support member; a protective member over a peripheral surface of a top surface of the conductive support member; a reflective layer over the conductive support member; and a light emitting structure over the reflective layer and the protective member, wherein the protective member has a thickness of about 2 μm to about 100 μm.

A method of manufacturing a light emitting device according to the embodiment may include the steps of forming a light emitting structure; forming a protective member having a thickness of about 2 μm to about 100 μm on the light emitting structure; forming a reflective layer on the light emitting layer within the protective member; forming a conductive support member on the protective member and the reflective layer; and dividing a plurality of chips into individual chips by performing an isolation process along a chip boundary area of the light emitting structure.

A light emitting device package according to the embodiment may include a body; first and second electrodes over the body; a light emitting device electrically connected to the first and second electrodes over the body; and a molding member surrounding the light emitting device, wherein the light emitting device includes conductive support member, a protective member having a thickness of about 2 μm to about 100 μm over a peripheral surface of a top surface of the conductive support member, a reflective layer over the conductive support member, and a light emitting structure over the reflective layer and the protective member.

The embodiment can provide the light emitting device capable of improving the reliability, a light emitting device package, and a method of manufacturing the light emitting device.

DETAILED DESCRIPTION OF THE EMBODIMENTS

Figure 1:
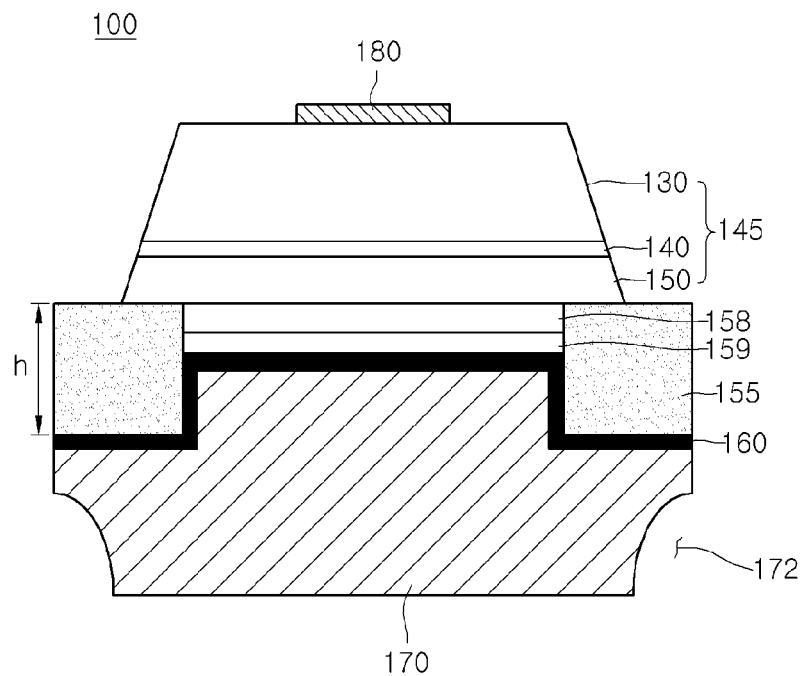
FIG. 1 is a sectional view showing a light emitting device according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device, a method of manufacturing the light emitting device, and a light emitting device package according to the embodiments will be described with reference to the accompanying drawings.

First Embodiment

FIG. 1 is a sectional view showing a light emitting device 100 according to the first embodiment.

Referring to FIG. 1, the light emitting device 100 includes a support electrode having a cavity 172 recessed inward at a lateral side of the support electrode, a reflective layer 159 formed on a first region which is a central region of the support electrode, an ohmic layer 158 formed on the reflective layer 159, a protective member 155 formed on a second region, which is disposed around the first region located at the center of the support electrode, a light emitting structure 145 formed on the ohmic layer 158 and the protective member 155, and an electrode 180 formed on the light emitting structure 145.

The support electrode includes a conductive support member 170 and a bonding layer 160 formed on the conductive support member 170.

The light emitting structure 145 is a minimum unit for generating light and at least includes a second conductive semiconductor layer 150, an active layer 140 on the second conductive semiconductor layer 150, and a first conductive semiconductor layer 130 on the active layer 140.

The electrode 180 and the conductive support member 170 serve as an electrode of the light emitting device 100 and supply power to the light emitting structure 145.

The conductive support member 170 may include at least one of Ti, Cr, Ni, Al, Pt, Au, W, Cu, Mo, CuW and a semiconductor substrate doped with impurities. Preferably, the semiconductor substrate includes a carrier semiconductor substrate including Si, Ge, GaAs, ZnO, SiC, or SiGe.

A cavity 172, which is curved inward, may be formed at a lower lateral portion of the conductive support member 170. The cavity 172 can be formed when the chip isolation process is performed to divide a plurality of chips into individual chips in the manufacturing process for the light emitting device 100, which will be described later in detail.

The bonding layer 160 may be formed on the conductive support member 170. The bonding layer 160 may improve the interfacial bonding strength between the light emitting structure 145 and the conductive support member 170.

For instance, the bonding layer 160 includes at least one of Ti, Au, Sn, Ni, Cr, Ga, In, Bi, Cu, Ag and Ta. In addition, the bonding layer 160 may have a multiple structure including a plurality of layers formed by using heterogeneous materials. The conductive support member 170 can be formed through the plating process as well as the bonding process. If the conductive support member 170 is formed through the plating process, a seed layer is formed instead of the bonding layer 160.

The reflective layer 159 may be formed on the bonding layer 160. The reflective layer 159 reflects the light incident from the light emitting structure 145 to increase the amount of light emitted to the outside, thereby improving the light efficiency of the light emitting device 100.

The reflective layer 159 may include a metal or an alloy including at least one of Ag, Al, Pd, Pt, and Cu having higher reflectance.

The ohmic layer 158 may be formed on the reflective layer 159. The ohmic layer 158 is formed for the ohmic contact between the second conductive semiconductor layer 150 of the light emitting structure 145 and the reflective layer 159.

The ohmic contact layer 158 may include a metal or a metal oxide. For instance, the ohmic contact layer 158 may include at least one of ITO, Ni, Pt, Ir, Rh and Ag, but the embodiment is not limited thereto.

In addition, a current blocking layer can be formed between the ohmic layer 158 and the second conductive semiconductor layer 150. At least a part of the current blocking layer overlaps with the electrode 180 to allow the current to widely spread on the light emitting structure 145.

The protective member 155 can be formed around the top surface of the bonding layer 160. The protective member 155 prevents the electric short between the light emitting structure 145 and the conductive support member 170.

Preferably, the protective member 155 has electric insulating property and includes a transparent material to minimize the light loss. For instance, the protective member 155 includes at least one selected from the group consisting of $SiO_2$, $Si_xO_y$, $Si_3N_4$, $Si_xN_y$, $SiO_xN_y$, $Al_2O_3$, $TiO_2$, ITO, AZO, and ZnO.

The protective member 155 may have a thickness (h) of about 2 μm to about 100 μm, preferably, about 5 μm to about 50 μm. Since the protective member 155 has a relatively thick thickness, the protective member 155 can prevent the electric short from occurring in the conductive support member 170 caused by burr during the chip isolation process.

In addition, since the protective member 155 has the above thickness (h), the bonding layer 160 may have a step portion at a lower peripheral portion thereof and the protective member 155 is formed on the step portion of the bonding layer 160. That is, a bottom surface of the protective member 155 is lower than a bottom surface of the reflective layer 159.

In addition, due to the protective member 155, a thickness of a middle part of the conductive support member 170 is thicker than a thickness of a peripheral part of the conductive support member 170, and the protective member 155 is disposed on the step portion defined between the middle part and the peripheral part of the conductive support member 170.

The light emitting structure 145 is formed on the ohmic layer 158 and the protective member 155.

A lateral side of the light emitting structure 145 can be inclined through the isolation process. Thus, a width of a lower portion of the light emitting structure 145 may be larger than a width of an upper portion of the light emitting structure 145, but the embodiment is not limited thereto. In addition, a top surface of the protective member 155 may be partially exposed through the isolation process.

The light emitting structure 145 may include the second conductive semiconductor layer 150, the active layer 140 on the second conductive semiconductor layer 150, and the first conductive semiconductor layer 130 on the active layer 140.

The light emitting structure 145 can be formed through the metal organic chemical vapor deposition (MOCVD), chemical vapor deposition (CVD), plasma-enhanced chemical vapor deposition (PECVD), molecular beam epitaxy (MBE), or hydride vapor phase epitaxy (HYPE) scheme, but the embodiment is not limited thereto.

The second conductive semiconductor layer 150 includes the p type semiconductor layer. The p type semiconductor layer may include the semiconductor material having the compositional formula of $In_xAl_yGa_{1-x-y}N$ ($0 \leq x \leq 1$, $0 \leq y \leq 1$, $0 \leq x+y \leq 1$). In detail, the second conductive semiconductor layer 150 may include one selected from the group consisting of InAlGaN, GaN, AlGaN, InGaN, AlN, and InN and may be doped with p type dopant, such as Mg, Zn, Ca, Sr, or Ba.

If the MOCVD scheme is employed, the second conductive semiconductor layer 150 can be formed by injecting at least one of trimethyl gallium (TMGa) gas, trimethyl indium (TMIn) gas, trimethyl aluminum (TMAl) gas, ammonia ($NH_3$) gas, nitrogen ($N_2$) gas and hydrogen ($H_2$) gas into the chamber together with silane ($SiH_4$) gas and $(EtCp_2Mg)\{Mg(C_2H_5C_5H_4)_2\}$ including p type dopant, such as Mg, into the chamber, but the embodiment is not limited thereto.

The active layer 140 may be formed on the second conductive semiconductor layer 150. The active layer 140 may include the semiconductor material having the compositional formula of $In_xAl_yGa_{1-x-y}N$ ($0 \leq x \leq 1$, $0 \leq y \leq 1$, $0 \leq x+y \leq 1$). In addition, the active layer 140 may have a single quantum well structure or a multiple quantum well (MQW) structure.

For instance, if the MOCVD scheme is employed, the active layer 140 having the multiple quantum structure of InGaN/GaN can be formed by injecting trimethyl gallium (TMGa) gas, trimethyl indium (TMIn) gas, trimethyl aluminum (TMAl) gas, ammonia ($NH_3$) gas or nitrogen ($N_2$) gas into the chamber, but the embodiment is not limited thereto.

The first conductive semiconductor layer 130 can be formed on the active layer 140. For instance the first conductive semiconductor layer 130 may include the semiconductor material having the compositional formula of $In_xAl_yGa_{1-x-y}N$ ($0 \leq x \leq 1$, $0 \leq y \leq 1$, $0 \leq x+y \leq 1$). For instance, the first conductive semiconductor layer 130 may include one selected from the group consisting of InAlGaN, GaN, AlGaN, InGaN, AlN, and InN and may be doped with n type dopant, such as Si, Ge or Sn.

For instance, if the MOCVD scheme is employed, the first conductive semiconductor layer 130 can be formed by injecting at least one of trimethyl gallium (TMGa) gas, trimethyl indium (TMIn) gas, trimethyl aluminum (TMAl) gas, ammonia ($NH_3$) gas, nitrogen ($N_2$) gas and hydrogen ($H_2$) gas and silane gas (SiH$_4$) including n type dopant, such as Si, into the chamber, but the embodiment is not limited thereto.

The n type dopant may be doped in a part of the first conductive semiconductor layer 130 or the concentration the n type dopant may be gradually increased or decreased in one direction of the first conductive semiconductor layer 130, but the embodiment is not limited thereto.

In addition, the first conductive semiconductor layer 130 may include a p type semiconductor layer and the second conductive semiconductor layer 150 may include an n type semiconductor layer. Further, a third conductive semiconductor layer (not shown) having polarity opposite to that of the first conductive semiconductor layer 130 can be formed on the first conductive semiconductor layer 130. Thus, the light emitting device may have one of NP, PN, NPN and PNP junction structures, but the embodiment is not limited thereto.

The electrode 180 may be formed on the first conductive semiconductor layer 130. For instance, the electrode 180 may include at least one of Al, Ti, Cr, Ni, Cu and Au, but the embodiment is not limited thereto.

Meanwhile, a concavo-convex pattern can be formed on the top surface of the first conductive semiconductor layer 130 to improve the light extraction efficiency of the light emitting device 100, but the embodiment is not limited thereto.

The thickness ranging from the active layer 140 to the bottom surface of the light emitting structure 145, that is, the top surface of the protective member 155 may be about 0.5 μm to about 1 μm.

Therefore, the protective member 155 has the thickness at least two times thicker than the thickness ranging from the active layer 140 to the bottom surface of the light emitting structure 145, that is, the top surface of the protective member 155. In detail, the protective member 155 has the thickness thicker than the thickness ranging from the active layer 140 to the bottom surface of the light emitting structure 145 by two to two hundred times, preferably, four to four hundred times, thereby preventing the electric short from occurring between the first conductive semiconductor layer 130 of the light emitting structure 145 and the conductive support member 170 caused by burr.

Hereinafter, the method of manufacturing the light emitting device 100 according to the first embodiment will be described in detail. In the following description, details of the elements or structures that have been already described will be omitted in order to avoid redundancy.

Figure 2:
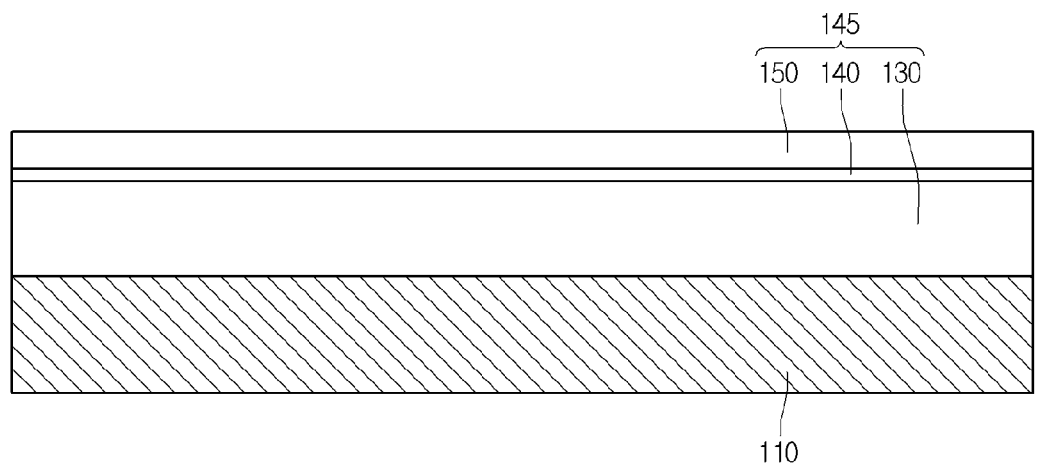
FIGS. 2 to 12 are sectional views showing a method of manufacturing a light emitting device according to the embodiment.

Referring to FIG. 2, the light emitting structure 145 is formed on the substrate 110.

The substrate 110 may include at least one of Al$_2$O$_3$, SiC, Si, GaAs, GaN, ZnO, Si, GaP, InP, and Ge, but the embodiment is not limited thereto.

The light emitting structure 145 is a minimum unit for generating light and at least includes the first conductive semiconductor layer 130, the active layer 140 on the first conductive semiconductor layer 130, and the second conductive semiconductor layer 150 on the active layer 140.

A buffer layer (not shown) can be formed between the first conductive semiconductor layer 130 and the substrate 110 to attenuate lattice mismatch between the first conductive semiconductor layer 130 and the substrate 110. The buffer layer may include the semiconductor material having the compositional formula of In$_x$Al$_y$Ga$_{1-x-y}$N ($0 \leq x \leq 1$, $0 \leq y \leq 1$, $0 \leq x+y \leq 1$). For instance, the buffer layer may include AlN or GaN.

Figure 3:
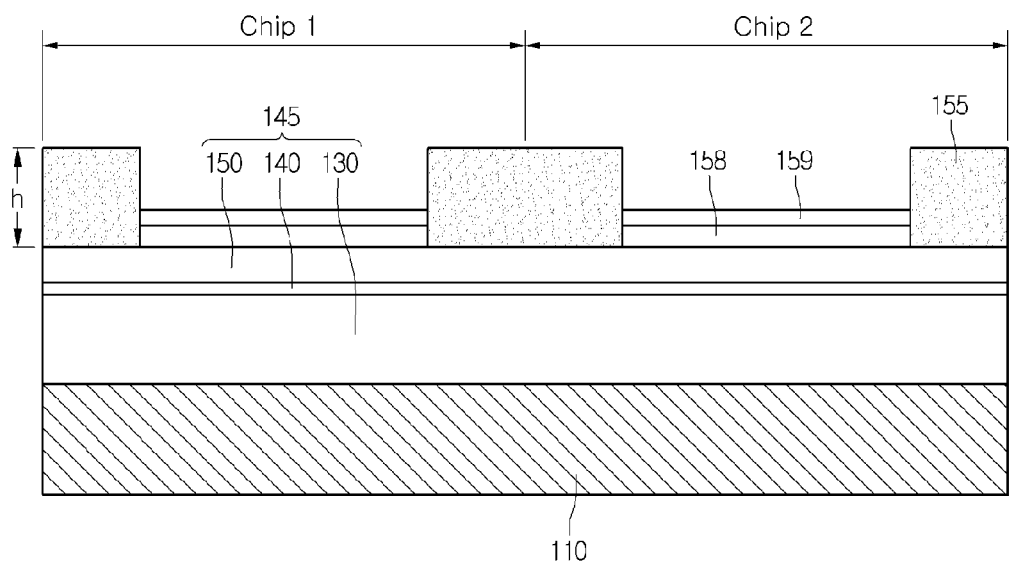
Figure 4:
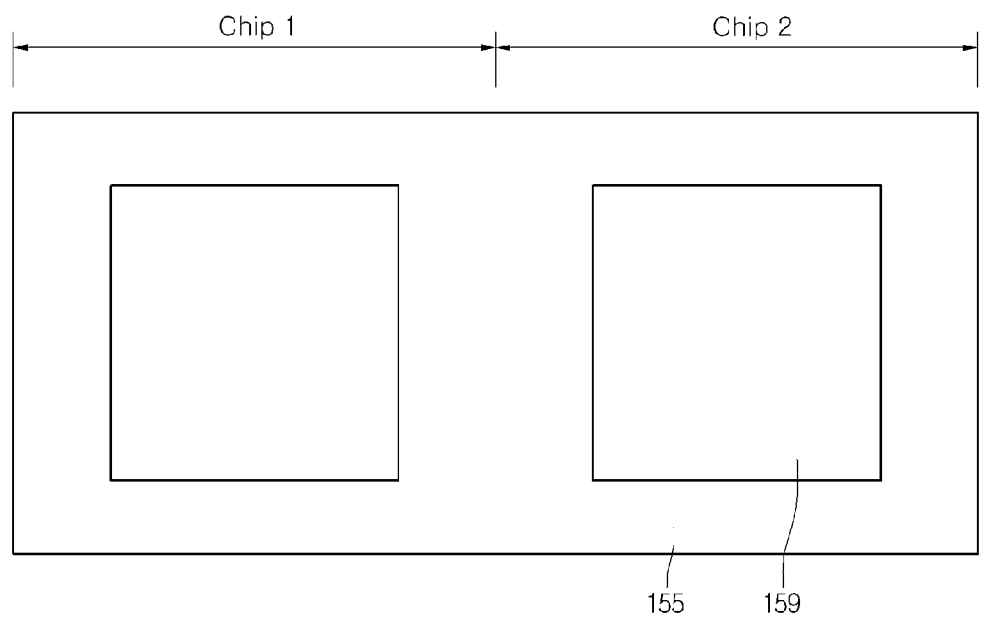

Referring to FIGS. 3 and 4, the protective member 155 is formed on the light emitting structure.

As can be seen from FIG. 4, which is a plan view of the light emitting device shown in FIG. 3, the protective member 144 may be formed around the top surface of individual chips.

The protective member 155, for example, includes at least one selected from the group consisting of SiO$_2$, Si$_x$O$_y$, Si$_3$N$_4$, Si$_x$N$_y$, SiO$_x$N$_y$, Al$_2$O$_3$, TiO$_2$, ITO, AZO, and ZnO.

In addition, the protective member 155 has the thickness (h) of about 2 μm to about 100 μm, which is at least two times thicker than the thickness ranging from the active layer 140 to the bottom surface of the light emitting structure 145, that is, the top surface of the protective member 155. In detail, the protective member 155 has the thickness thicker than the thickness ranging from the active layer 140 to the bottom surface of the light emitting structure 145 by two to two hundred times, thereby preventing the electric short from occurring between the first conductive semiconductor layer 130 of the light emitting structure 145 and the conductive support member 170 caused by burr when the chip isolation process is performed to divide the plural chips into individual chips.

Figure 5:
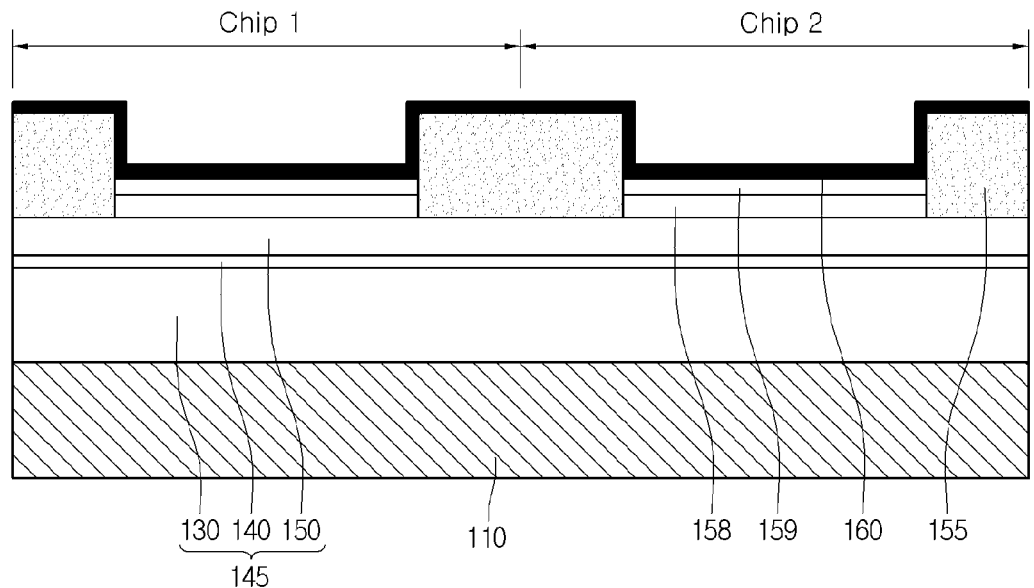

Referring to FIG. 5, the reflective layer 159 and the ohmic layer 158 are formed on the light emitting structure 145 inside the protective member 155, and the bonding layer 160 is formed on the reflective layer 159 and the protective member 155.

Since the protective member 155 has a relatively thick thickness (h), the bonding layer 160 may have a concavo-convex structure. In detail, a peripheral region of the bonding layer 160 where the protective member 155 is formed may be higher than a region of the bonding layer 160 where the protective member 155 is not formed.

Figure 6:
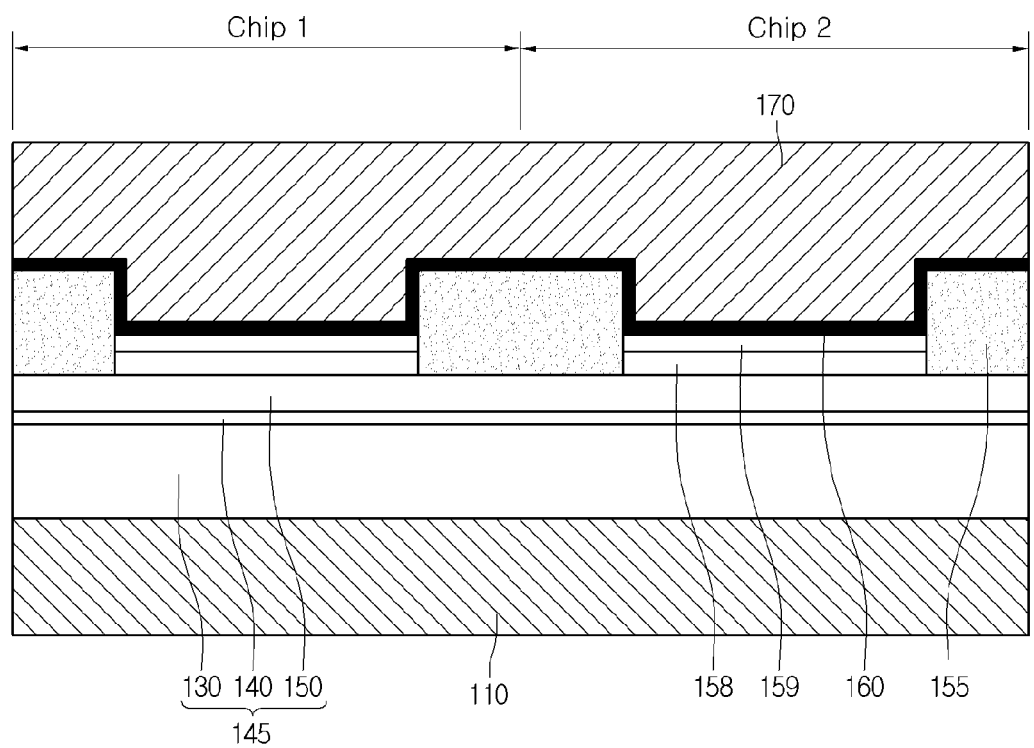

Referring to FIG. 6, the conductive support member 170 is formed on the bonding layer 160.

The conductive support member 170 can be formed through at least one of plating, coating and deposition processes or can be attached in the form of a sheet, but the embodiment is not limited thereto. Since the conductive support member 170 is formed on the bonding layer 160 having the concavo-convex structure, the conductive support member 170 may have step portions along the concavo-convex structure of the bonding layer 160.

Figure 7:
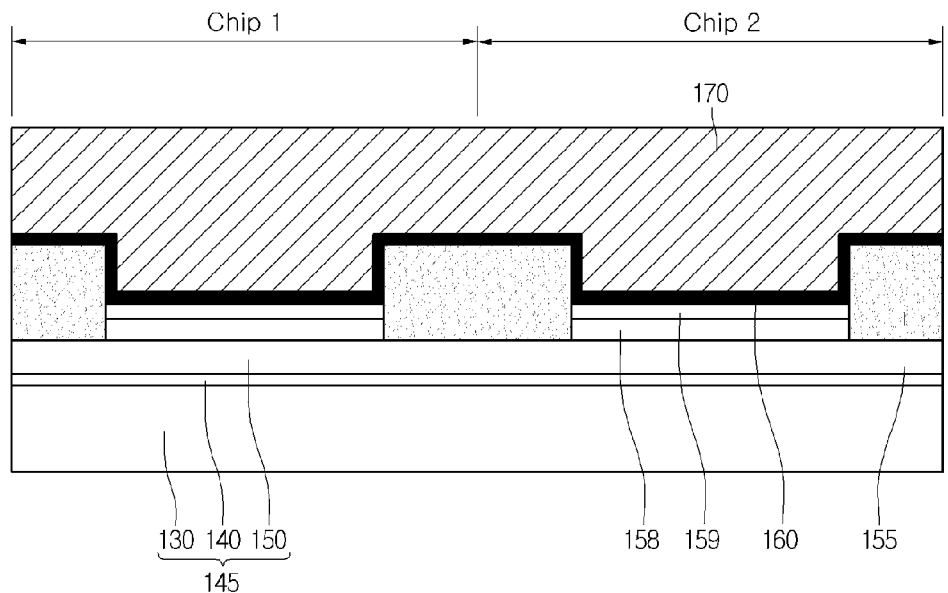

Referring to FIG. 7, the substrate 110 is removed through at least one of an LLO (laser lift off) process and an etching process.

Figure 8:
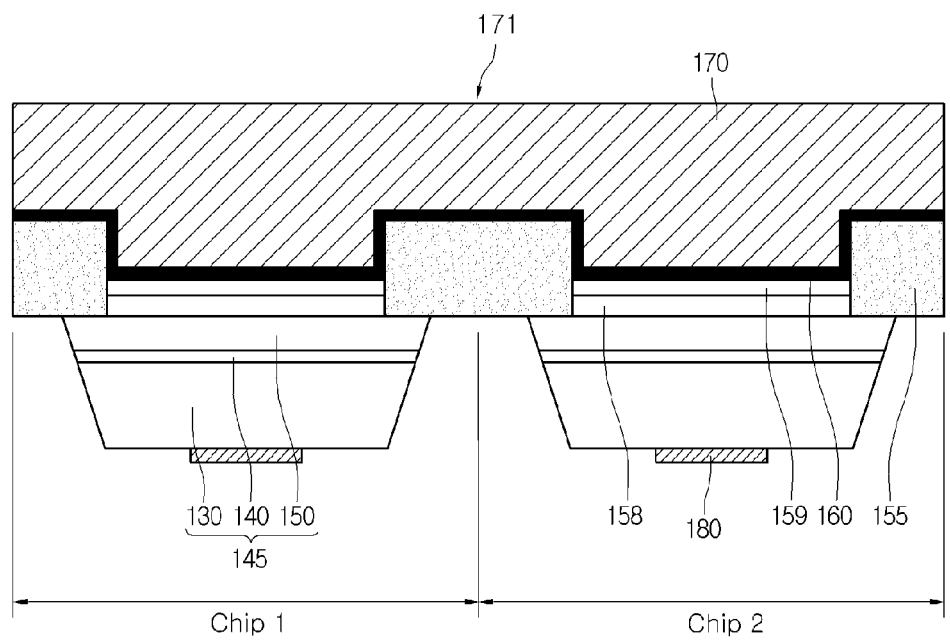

Referring to FIG. 8, the isolation process is performed with respect to the light emitting structure 145 to divide the plural chips into individual chips.

The isolation process may include a photolithography and an etching process, but the embodiment is not limited thereto.

The semiconductor layer grown from a single wafer may have thickness variation between the central region and the peripheral region of the wafer. If the etching process is performed based on the chip thickness of the central region of the wafer after separating the growth substrate, a metal under the chip may be etched at the peripheral region of the wafer having a relatively thin thickness, resulting in the failure of the chip.

According to the embodiment, the thick protective member 155 is provided to prevent the metal under the chip from being etched, so that the product yield of the chips produced from the single wafer can be improved.

Figure 9:
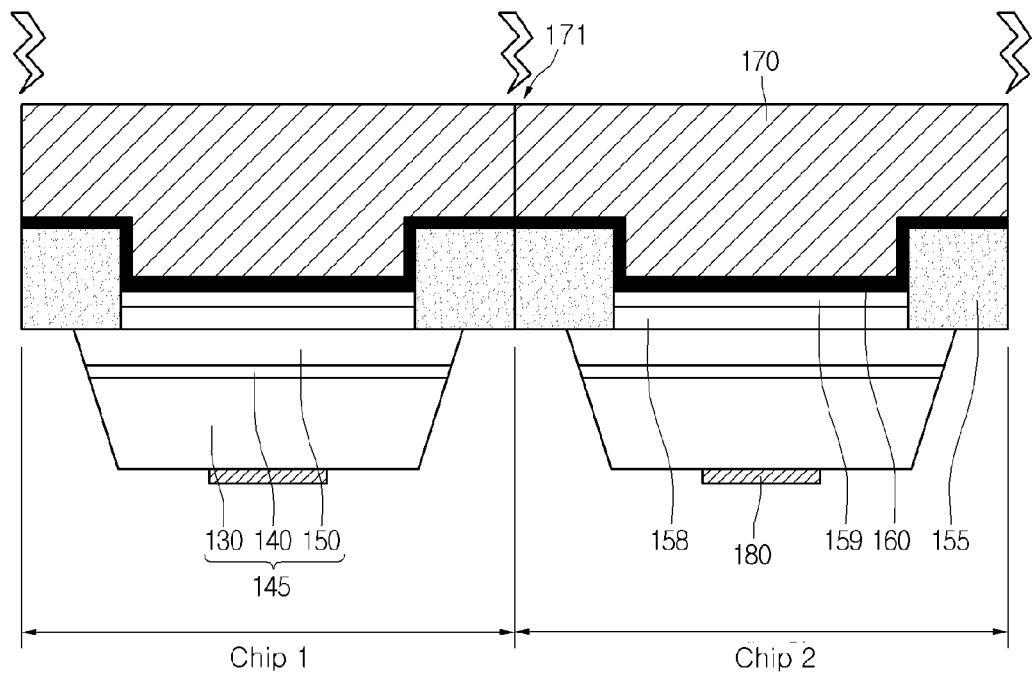
Figure 10:
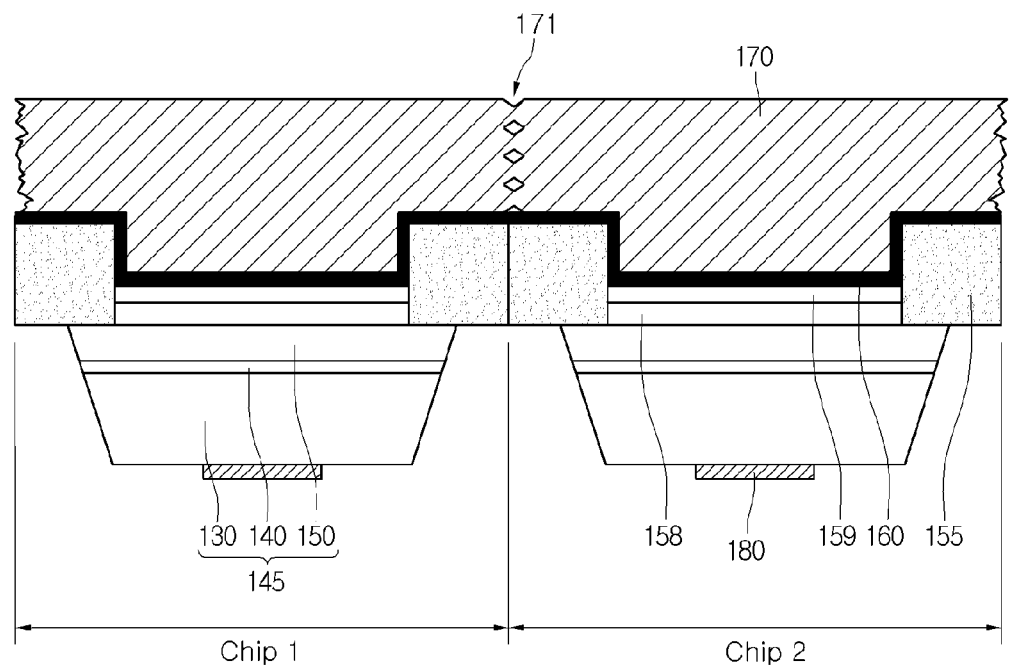

Referring to FIGS. 9 and 10, a laser scribing process is performed onto a chip boundary region 171 to divide and distinguish the individual chips from each other. The laser scribing process can be performed by using Nd:YAG laser, but the embodiment is not limited thereto.

The laser scribing process can be performed from the top surface of the conductive support member 170 with intensity sufficient for applying an impact to the protective member 155 through the conductive support member 170. In detail, the protective member 155 serves as a stop layer in the laser scribing process, so that the light emitting structure 145 can be prevented from being damaged during the laser scribing process.

Since the protective member 155 has the relatively thick thickness (h), even if the burr is formed in the conductive support member 170 during the laser scribing process, the burr may rarely make contact with the light emitting structure 145, so that the reliability of the light emitting device 100 can be improved.

Meanwhile, as shown in FIG. 10, the chip boundary region may not be completely separated through the laser scribing process, and the conductive support member 170 may be partially recombined at the chip boundary region.

This is because the conductive support member 170 includes a metal having high flexibility, such as Cu or Au. That is, the chip boundary region 171 is divided while being melted through the laser scribing process and then recombined when the chip boundary region 171 is cured due to the flexibility of the conductive support member 170.

Since the protective member 155 serves as the stop layer during the laser scribing process, the protective member 155 may not be completely separated by the laser scribing process, but crack may be generated in the protective member 155.

The protective member 155 includes a material, such as $SiC_2$, which may be broken with directionality, so the protective member 155 can be easily separated in the subsequent breaking process due to the crack.

Meanwhile, before the laser scribing process is performed, a protective layer (not shown) can be formed on the conductive support member 170 to protect the light emitting device 100 from metal fragments generated during the laser scribing process, but the embodiment is not limited thereto. For instance, the protective layer includes photoresist.

Figure 11:
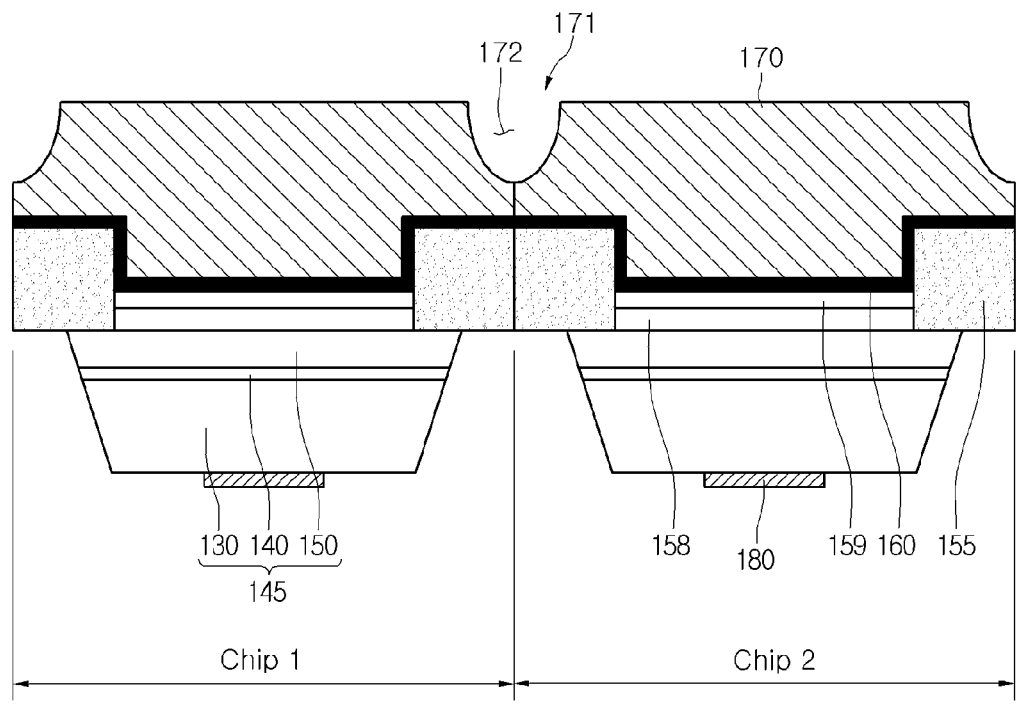

Referring to FIG. 11, the etching process is performed onto the recombined chip boundary region 171 of the conductive support member 170.

The recombined chip boundary region 171 of the conductive support member 170 may be substantially divided through the etching process.

The etching process, for example, may include a wet etching process and a dry etching process. The wet etching process is preferable in terms of the process efficiency. The wet etching process can be performed by using etchant, such as HF, KOH, $H_2SO_4$, $H_2O_2$, HCl, NaOH, $NH_4OH$, $HNO_3$, or BOE.

As shown in FIG. 11, if the isotropic wet etching process is performed with respect to the chip boundary region 171, the curved surface 172 is formed at the lateral side of the conductive support member 170.

Figure 12:
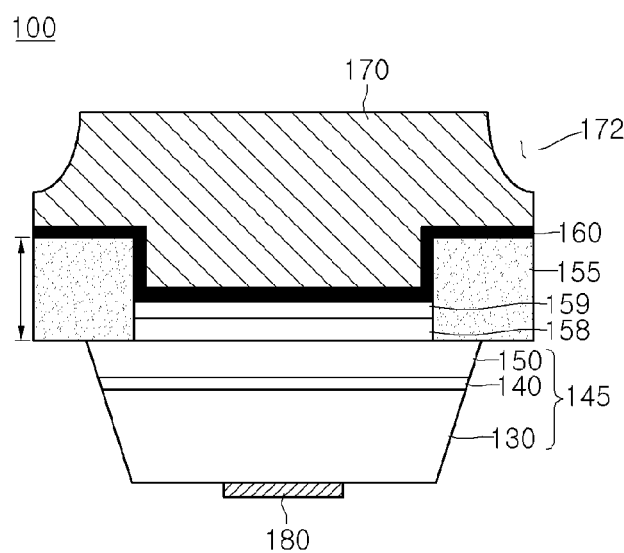

Referring to FIGS. 11 and 12, the breaking process is performed to provide the light emitting device 100 according to the first embodiment as an individual chip unit.

The breaking process can be preformed by using a cutter to completely separate the plural chips into individual chip units.

The conductive support member 170 is substantially divided through the laser scribing process and the etching process before the breaking process, and the crack is generated in the protective member 155 by the laser scribing process, so the breaking process can be easily performed. Thus, the defect rate of the chips occurring in the breaking process may be reduced.

Meanwhile, the burr generated in the conductive support member 170 during the laser scribing process is almost etched, but the burr adjacent to the protective member 155 may remain without being etched. However, since the protective member 155 has the relatively thick thickness, the burr adjacent to the protective member 155 may be spaced apart from the first conductive semiconductor layer 130 and the active layer 140, or from the active layer 140 and the second conductive semiconductor layer 150, thereby preventing the electric short among the first conductive semiconductor layer 130, the active layer 140, the second conductive semiconductor layer 150, and the conductive support member 170.

In addition, a plurality of light emitting devices 100 are connected one another by the protective member 155 until the breaking process is performed, so the handling of the wafer may be facilitated when the process is performed for the wafer.

Second Embodiment

Hereinafter, a light emitting device 100B and a method of manufacturing the same according to the second embodiment will be described in detail. In the following description of the second embodiment, details of the elements or structures that have been already described in the first embodiment will be omitted in order to avoid redundancy.

The light emitting device 100B according to the second embodiment is identical to the light emitting device 100 according to the first embodiment except for the shape of the protective member.

Figure 13:
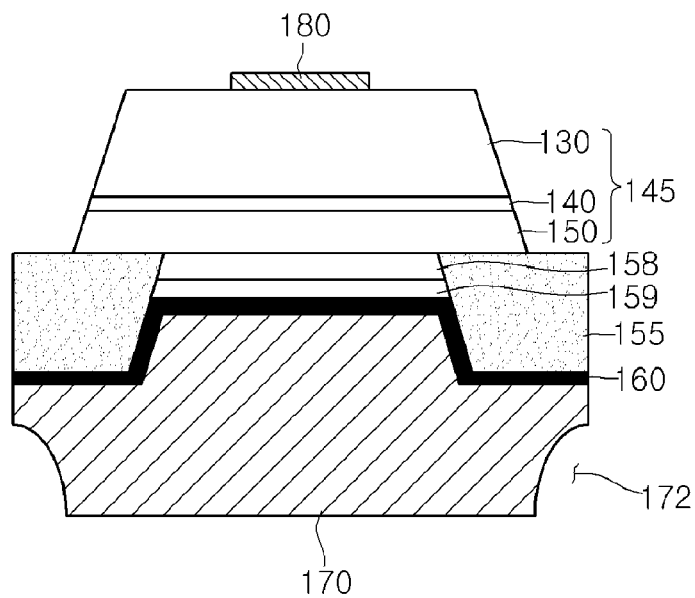
FIG. 13 is a sectional view showing a light emitting device according to the second embodiment.

FIG. 13 is a sectional view showing the light emitting device 100B according to the second embodiment.

Referring to FIG. 13, the light emitting device 100B includes a conductive support member 170 having a curved surface 172 recessed inward at a lateral side of the conductive support member 170, a bonding layer 160 formed on the conductive support member 170, a reflective layer 159 formed on the bonding layer 160, an ohmic layer 158 formed on the reflective layer 159, a protective member 155 formed around the top surface of the bonding layer 160, a light emitting structure 145 formed on the ohmic layer 158 and the protective member 155, and an electrode 180 formed on the light emitting structure 145.

An inner surface of the protective member 155 may be inclined. That is, the width of the upper portion of the protective member 155 may be larger than the width of the lower portion of the protective member 155.

If the protective member 155 has the inclined inner surface, the ohmic layer 158, the reflective layer 159, the bonding layer 160 and the conductive support member 170 can be easily formed. Especially, if the conductive support member 170 is formed through the deposition process, the conductive support member 170 can be easily deposited along the inclined inner surface of the protective member 155.

Third Embodiment

Hereinafter, a light emitting device 100C and a method of manufacturing the same according to the third embodiment will be described in detail. In the following description of the third embodiment, details of the elements or structures that have been already described in the first embodiment will be omitted in order to avoid redundancy.

The light emitting device 100C according to the third embodiment is identical to the light emitting device 100 according to the first embodiment except for the shape of the reflective layer.

Figure 14:
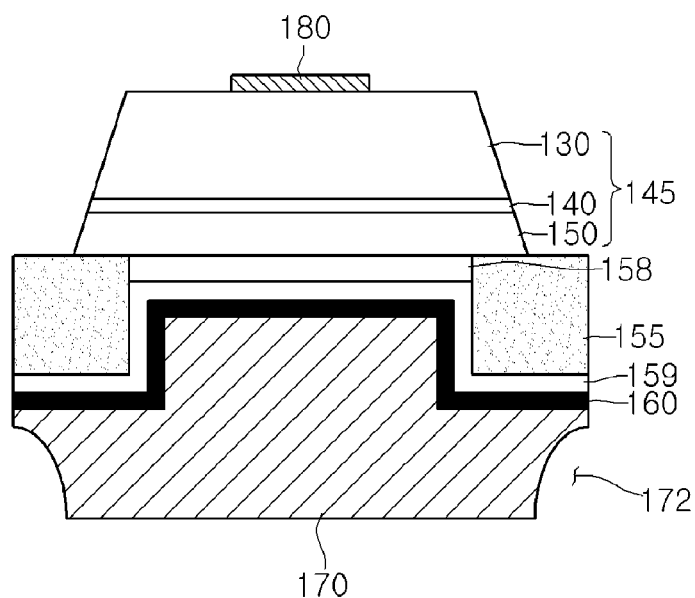
FIG. 14 is a sectional view showing a light emitting device according to the third embodiment.

FIG. 14 is a sectional view showing the light emitting device 100C according to the third embodiment.

Referring to FIG. 14, the light emitting device 100C includes a conductive support member 170 having a curved surface 172 recessed inward at a lateral side of the conductive support member 170, a bonding layer 160 formed on the conductive support member 170, a reflective layer 159 formed on the bonding layer 160, an ohmic layer 158 formed on the reflective layer 159, a protective member 155 formed around the top surface of the reflective layer 159, a light emitting structure 145 formed on the ohmic layer 158 and the protective member 155, and an electrode 180 formed on the light emitting structure 145.

The reflective layer 159 may be formed between the ohmic layer 158 and the bonding layer 160 and between the protective member 155 and the bonding layer 160.

Since the protective member 155 has the relatively thick thickness (h), a step portion may be formed between the bonding layer 160 and the reflective layer 159, and the protective member 155 may be formed on the step portion.

Fourth Embodiment

Hereinafter, a light emitting device 100D and a method of manufacturing the same according to the fourth embodiment will be described in detail. In the following description of the fourth embodiment, details of the elements or structures that have been already described in the first embodiment will be omitted in order to avoid redundancy.

The light emitting device 100D according to the fourth embodiment is identical to the light emitting device 100 according to the first embodiment except for the shape of the reflective layer.

Figure 15:
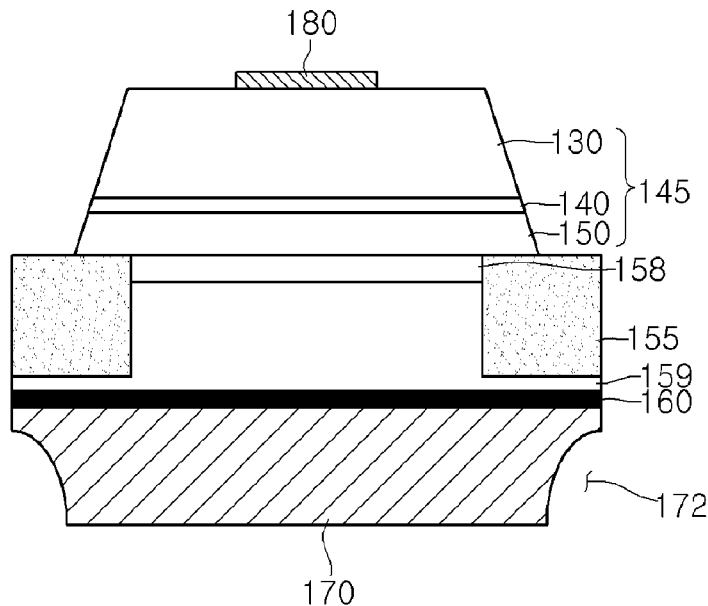
FIG. 15 is a sectional view showing a light emitting device according to the fourth embodiment.

FIG. 15 is a sectional view showing the light emitting device 100D according to the fourth embodiment.

Referring to FIG. 15, the light emitting device 100D includes a conductive support member 170 having a curved surface 172 recessed inward at a lateral side of the conductive support member 170, a bonding layer 160 formed on the conductive support member 170, a reflective layer 159 formed on the bonding layer 160, an ohmic layer 158 formed on the reflective layer 159, a protective member 155 formed around the top surface of the reflective layer 159, a light emitting structure 145 formed on the ohmic layer 158 and the protective member 155, and an electrode 180 formed on the light emitting structure 145.

Since the protective member 155 has the relatively thick thickness (h), the middle region of the reflective layer 159 may be thicker than the peripheral region of the reflective layer 159. That is, the peripheral region of the reflective layer 159 where the protective member 155 is formed is thinner than the middle region of the reflective layer 159 where the protective member 155 is not formed.

In addition, the bottom surface of the reflective layer 159 may be flattened. Thus, the bonding layer 160 formed under the reflective layer 159 is also flattened, so that the conductive support member 170 can be easily formed under the bonding layer 160.

The reflective layer 159 can be formed through at least one of the deposition process and the plating process, but the embodiment is not limited thereto.

Fifth Embodiment

Hereinafter, a light emitting device 100E and a method of manufacturing the same according to the fifth embodiment will be described in detail. In the following description of the fifth embodiment, details of the elements or structures that have been already described in the first embodiment will be omitted in order to avoid redundancy.

The light emitting device 100E according to the fifth embodiment is identical to the light emitting device 100 according to the first embodiment except for the shape of the bonding layer and the reflective layer.

Figure 16:
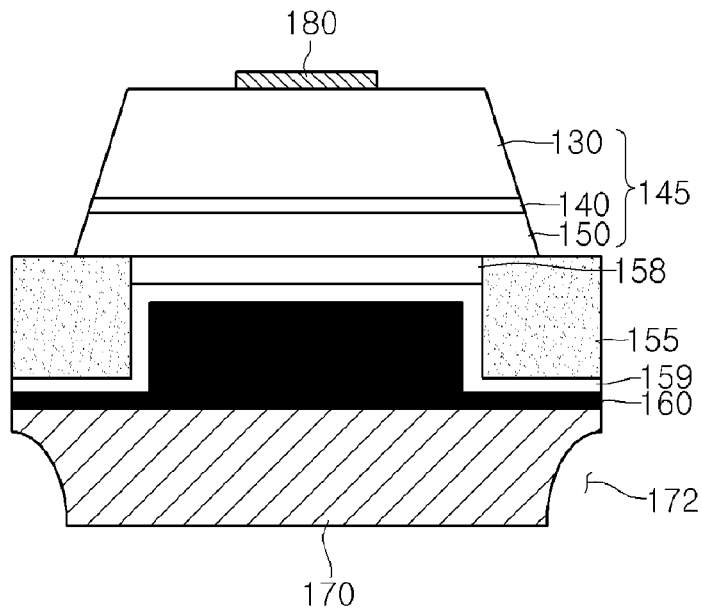
FIG. 16 is a sectional view showing a light emitting device according to the fifth embodiment.

FIG. 16 is a sectional view showing the light emitting device 100E according to the fifth embodiment.

Referring to FIG. 16, the light emitting device 100E includes a conductive support member 170 having a curved surface 172 recessed inward at a lateral side of the conductive support member 170, a bonding layer 160 formed on the conductive support member 170, a reflective layer 159 formed on the bonding layer 160, an ohmic layer 158 formed on the reflective layer 159, a protective member 155 formed around the top surface of the reflective layer 159, a light emitting structure 145 formed on the ohmic layer 158 and the protective member 155, and an electrode 180 formed on the light emitting structure 145.

The reflective layer 159 may be formed between the ohmic layer 158 and the bonding layer 160 and between the protective member 155 and the bonding layer 160.

The bonding layer 160 is formed under the reflective layer 159. Since the bottom surface of the reflective layer 159 is flattened, the conductive support member 170 can be easily formed.

As a result, the middle region of the bonding layer 160 may be thicker than the peripheral region of the bonding layer 160. That is, the peripheral region of the bonding layer 160 where the protective member 155 is formed is thinner than the middle region of the bonding layer 160 where the protective member 155 is not formed.

Sixth Embodiment

Hereinafter, a light emitting device 100F and a method of manufacturing the same according to the sixth embodiment will be described in detail. In the following description of the sixth embodiment, details of the elements or structures that have been already described in the first embodiment will be omitted in order to avoid redundancy.

The light emitting device 100F according to the sixth embodiment is identical to the light emitting device 100 according to the first embodiment except for a current blocking layer.

Figure 17:
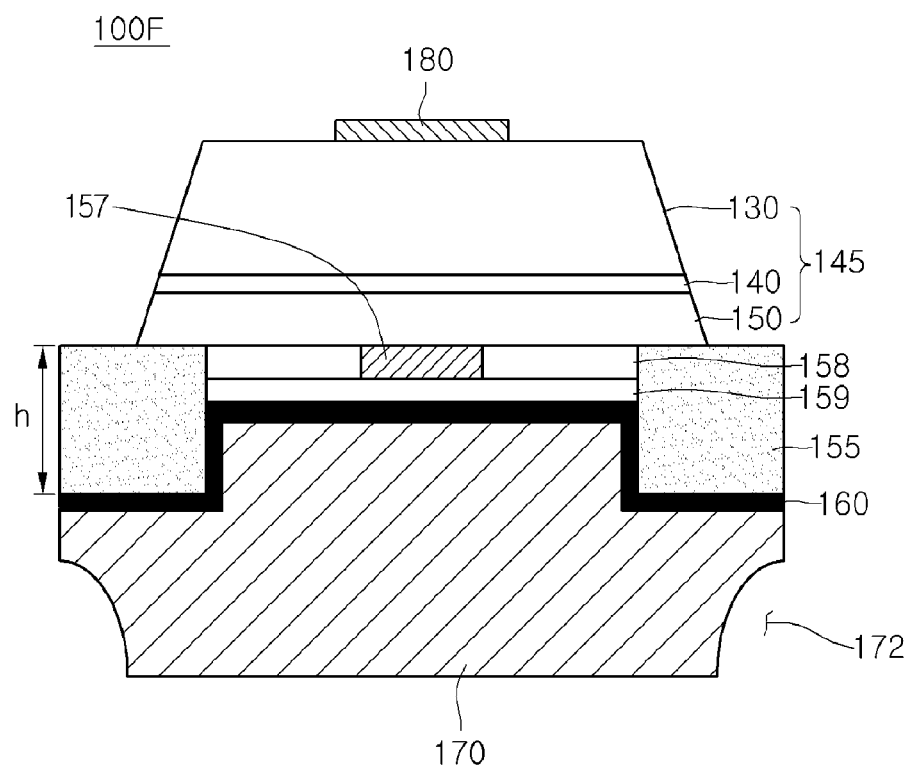
FIG. 17 is a sectional view showing a light emitting device according to the sixth embodiment.

FIG. 17 is a sectional view showing the light emitting device 100F according to the sixth embodiment.

Referring to FIG. 17, the light emitting device 100F includes a conductive support member 170 having a curved surface 172 recessed inward at a lateral side of the conductive support member 170, a bonding layer 160 formed on the conductive support member 170, a reflective layer 159 formed on the bonding layer 160, an ohmic layer 158 formed on the reflective layer 159, a current blocking layer 157 formed on the reflective layer 159, a protective member 155 formed around the top surface of the bonding layer 160, a light emitting structure 145 formed on the ohmic layer 158, the current blocking layer 157 and the protective member 155, and an electrode 180 formed on the light emitting structure 145.

The current blocking layer 157 spreads the current flowing through the light emitting structure 145, thereby improving the light efficiency of the light emitting device 100F.

The current blocking layer 157 may include an insulating material or a material capable of forming a schottky contact with respect to the light emitting structure 145. In addition, the current blocking layer 157 may include a material different from the material for the ohmic layer 158 to spread the current, but embodiment is not limited thereto.

For instance, the current blocking layer 157 may include at least one selected from the group consisting of $SiO_2$, $Si_xO_y$, $Si_3N_4$, $Si_xN_y$, $SiO_xN_y$, $Al_2O_3$, $TiO_2$, ITO, AZO, and ZnO.

Preferably, at least a part of the current blocking layer 157 overlaps with the electrode 180 in the longitudinal direction.

In addition, when the reflective layer 159 makes ohmic-contact with the light emitting structure 145, the current blocking layer 157 may be surrounded by the reflective layer 159, but the embodiment is not limited thereto.

<Light Emitting Device Package>

Figure 18:
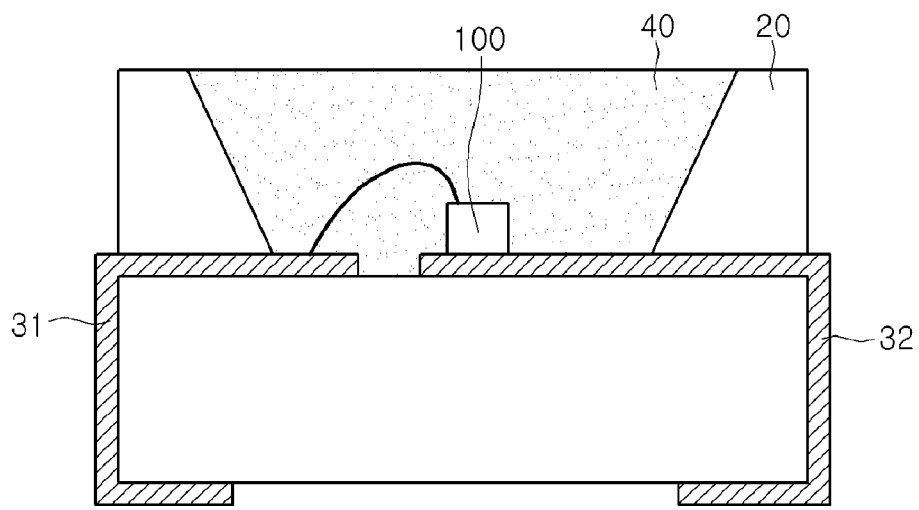
FIG. 18 is a sectional view showing a light emitting device package including a light emitting device according to the embodiments.

FIG. 18 is a sectional view showing a light emitting device package having the light emitting device 100 according to the embodiment.

Referring to FIG. 18, the light emitting device package includes a body 20, first and second electrode layers 31 and 32 formed on the body 20, the light emitting device 100 provided on the body 20 and electrically connected to the first and second electrode layers 31 and 32 and a molding member 40 that surrounds the light emitting device 100.

The body 20 may include silicon, synthetic resin or metallic material. An inclined surface may be formed around the light emitting device 100.

The first and second electrode layers 31 and 32 are electrically isolated from each other to supply power to the light emitting device 100. In addition, the first and second electrode layers 31 and 32 reflect the light emitted from the light emitting device 100 to improve the light efficiency and dissipate heat generated from the light emitting device 100 to the outside.

The light emitting device 100 can be installed on the body 20 or the first or second electrode layer 31 or 32.

Although it is illustrated that the light emitting device 100 is electrically connected to the first and second electrode layers 31 and 32 through a wire, the embodiment is not limited thereto. For instance, the light emitting device 100 can be electrically connected to the first and second electrode layers 32 through a die bonding scheme or a flip chip scheme.

The molding member 40 surrounds the light emitting device 100 to protect the light emitting device 100. In addition, the molding member 40 may include luminescence materials to change the wavelength of the light emitted from the light emitting device 100.

The light emitting device package according to the embodiment can be used as a lighting system, such as a backlight unit, an indicator, a lamp or a street lamp.

Hereinafter, applications of the disclosure will be described with reference to FIGS. 19 and 20.

Figure 19:
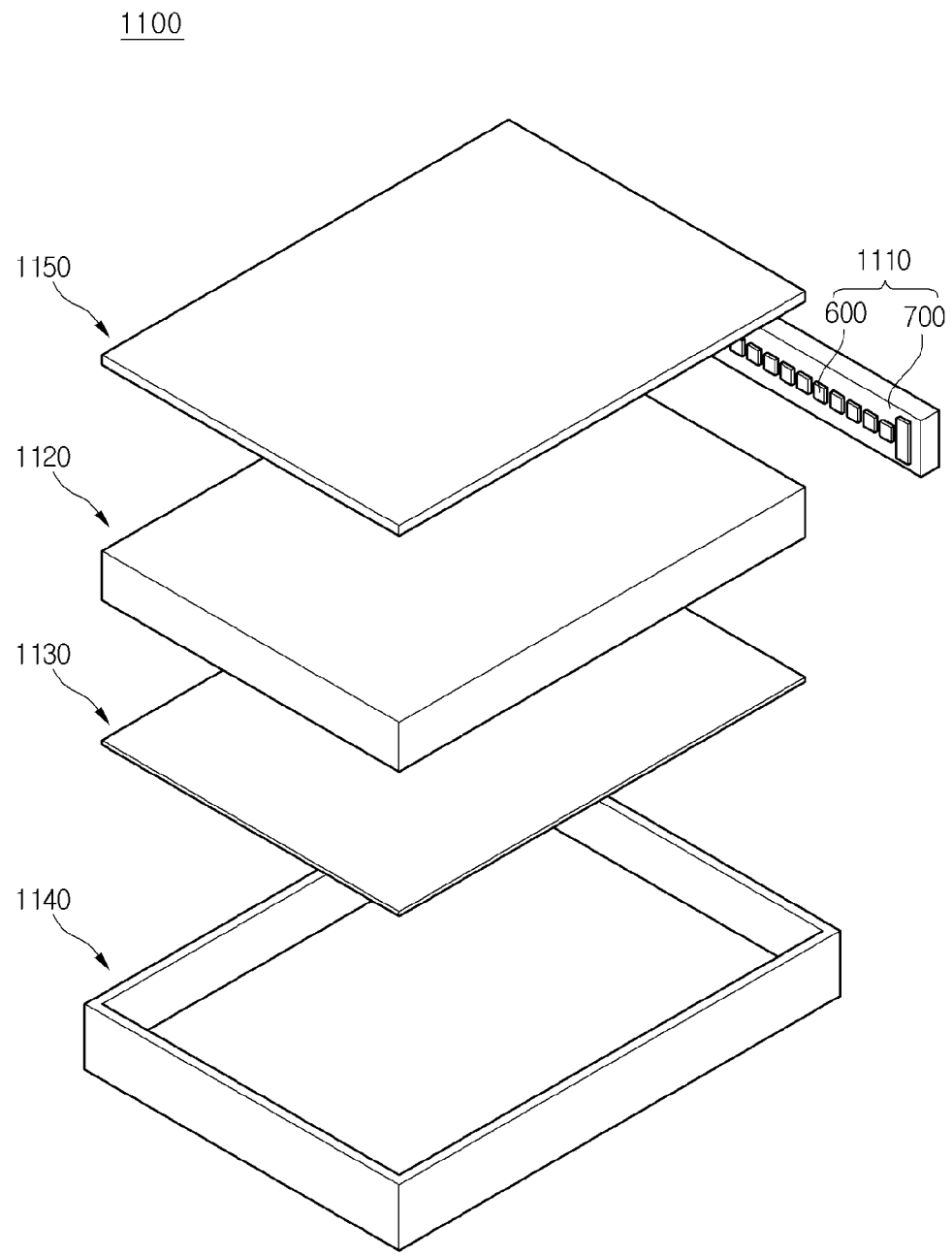
FIG. 19 is an exploded perspective view showing a backlight unit including a light emitting device according to the embodiment.

FIG. 19 is an exploded perspective view showing a backlight unit including the light emitting device package according to the embodiment.

The backlight unit 1100 shown in FIG. 19 is an example of a lighting system and the embodiment is not limited thereto.

Referring to FIG. 19, the backlight unit 1100 includes a bottom cover 1140, a light guide member 1120 installed in the bottom cover 1140, and a light emitting module 1110 installed on at least one lateral side or the bottom surface of the light guide member 1120. In addition, a reflective sheet 1130 is disposed under the light guide member 1120.

The bottom cover 1140 has a box shape having an open top surface to receive the light guide member 1120, the light emitting module 1110 and the reflective sheet 1130 therein. In addition, the bottom cover 1140 may include a metallic material or a resin material, but the embodiment is not limited thereto.

The light emitting module 1110 may include a plurality of light emitting device packages 600 installed on a substrate 700. The light emitting device packages 600 provide the light to the light guide member 1120.

As shown in FIG. 19, the light emitting module 1110 is installed on at least one inner side of the bottom cover 1140 to provide the light to at least one side of the light guide member 1120.

In addition, the light emitting module 1110 can be provided below the bottom cover 1140 to provide the light toward the bottom surface of the light guide member 1120. Such an arrangement can be variously changed according to the design of the backlight unit 1100 and the embodiment is not limited thereto.

The light guide member 1120 is installed in the bottom cover 1140. The light guide member 1120 converts the light emitted from the light emitting module 1110 into the surface light to guide the surface light toward a display panel (not shown).

The light guide member 1120 may include a light guide plate. For instance, the light guide plate may include one selected from the group consisting of acryl-based resin, such as PMMA (polymethyl methacrylate), PET (polyethylene terephthalate), PC (polycarbonate), COC and PEN (polyethylene naphthalate) resin.

An optical sheet 1150 may be provided over the light guide member 1120.

The optical sheet 1150 may include at least one of a diffusion sheet, a light collection sheet, a brightness enhancement sheet, and a fluorescent sheet. For instance, the optical sheet 1150 has a stack structure of the diffusion sheet, the light collection sheet, the brightness enhancement sheet, and the fluorescent sheet. In this case, the diffusion sheet uniformly diffuses the light emitted from the light emitting module 1110 such that the diffused light can be collected on the display panel by the light collection sheet. The light output from the light collection sheet is randomly polarized and the brightness enhancement sheet increases the degree of polarization of the light output from the light collection sheet. The light collection sheet may include a horizontal and/or vertical prism sheet. In addition, the brightness enhancement sheet may include a dual brightness enhancement film and the fluorescent sheet may include a transmittive plate or a transmittive film including luminescence materials.

The reflective sheet 1130 can be disposed below the light guide member 1120. The reflective sheet 1130 reflects the light, which is emitted through the bottom surface of the light guide member 1120, toward the light exit surface of the light guide member 1120. The reflective sheet 1130 may include resin material having high reflectivity, such as PET, PC or PVC resin, but the embodiment is not limited thereto.

Figure 20:
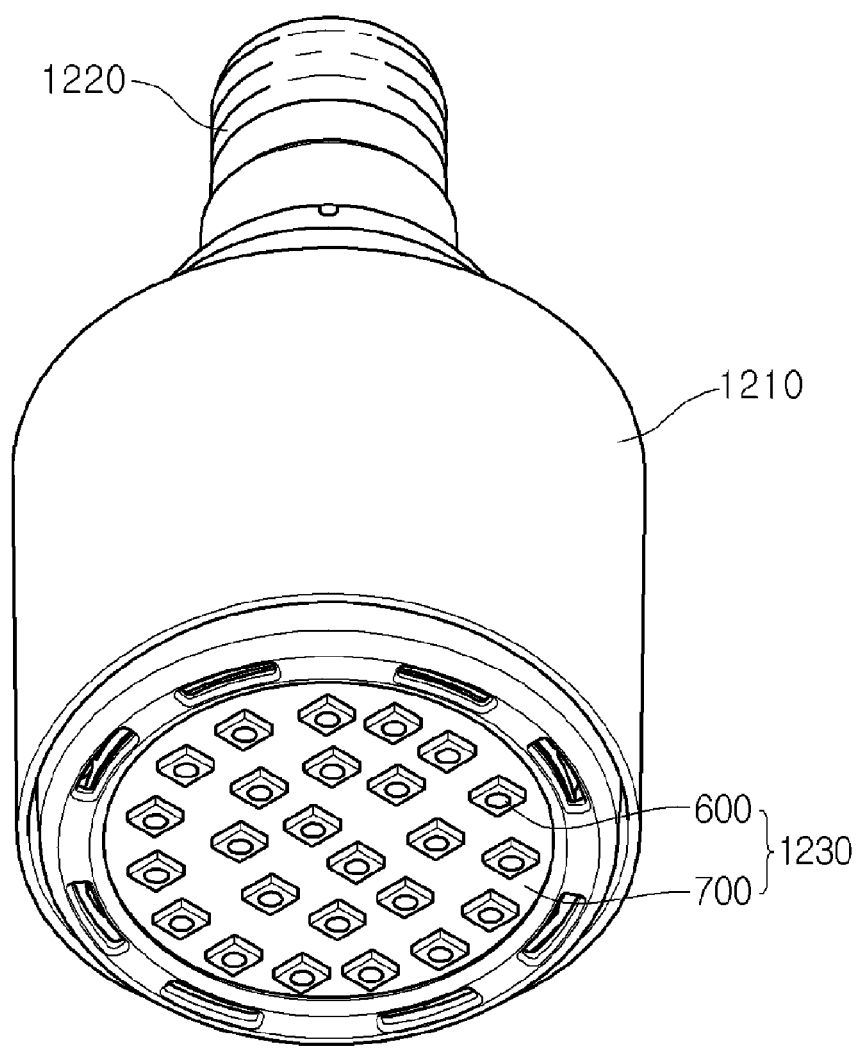
FIG. 20 is a perspective view showing a lighting unit including a light emitting device according to the embodiment.

FIG. 20 is a perspective view showing a lighting unit 1200 including the light emitting device according to the embodiment. The lighting unit 1200 shown in FIG. 20 is an example of a lighting system and the embodiment is not limited thereto.

Referring to FIG. 20, the lighting unit 1200 includes a case body 1210, a light emitting module 1230 installed in the case body 1210, and a connection terminal 1220 installed in the case body 1210 to receive power from an external power source.

Preferably, the case body 1210 includes material having superior heat dissipation property. For instance, the case body 1210 includes metallic material or resin material.

The light emitting module 1230 may include a substrate 700 and at least one light emitting device package 600 installed on the substrate 700.

The substrate 700 includes an insulating member printed with a circuit pattern. For instance, the substrate 700 includes a PCB (printed circuit board), an MC (metal core) PCB, a flexible PCB, or a ceramic PCB.

In addition, the substrate 700 may include a material that effectively reflects the light. The surface of the substrate 700 can be coated with a color, such as a white color or a silver color, to effectively reflect the light.

At least one light emitting device package 600 according to the embodiment can be installed on the substrate 700. Each light emitting device package 600 may include at least one LED (light emitting diode). The LED may include a colored LED that emits the light having the color of red, green, blue or white and a UV (ultraviolet) LED that emits UV light.

The LEDs of the light emitting module 1230 can be variously combined to provide various colors and brightness. For instance, the white LED, the red LED and the green LED can be combined to achieve the high color rendering index (CRI). In addition, a fluorescent sheet can be provided in the path of the light emitted from the light emitting module 1230 to change the wavelength of the light emitted from the light emitting module 1230. For instance, if the light emitted from the light emitting module 1230 has a wavelength band of blue light, the fluorescent sheet may include yellow luminescence materials. In this case, the light emitted from the light emitting module 1230 passes through the fluorescent sheet so that the light is viewed as white light.

The connection terminal 1220 is electrically connected to the light emitting module 1230 to supply power to the light emitting module 1230. Referring to FIG. 20, the connection terminal 1220 has a shape of a socket screw-coupled with the external power source, but the embodiment is not limited thereto. For instance, the connection terminal 1220 can be prepared in the form of a pin inserted into the external power source or connected to the external power source through a wire.

According to the lighting system as mentioned above, at least one of the light guide member, the diffusion sheet, the light collection sheet, the brightness enhancement sheet and the fluorescent sheet is provided in the path of the light emitted from the light emitting module, so that the desired optical effect can be achieved.

In the backlight unit 1100 and the lighting system 1200 shown in FIGS. 19 and 20, the light emitting device package shown in FIG. 18 is included in the light emitting module 1230, so that the superior light efficiency can be achieved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a support electrode including a first region and a second region formed around the first region with a thickness thinner than a thickness of the first region, and the support electrode formed at a lateral side thereof with a curved surface;
a reflective layer over the support electrode;
a protective insulative member over the second region of the support electrode; and
a light emitting structure located over the reflective layer, the light emitting structure including a first conductive semiconductor layer, a second conductive semiconductor layer, and an active layer interposed between the first and second conductive semiconductor layers,
wherein the protective insulative member has an inner surface and an outer surface, the distance between the inner surface and outer surface defining a width of the protective insulative member and the width increases from the bottom of the protective insulative member to the top of the protective insulative member.

2. The light emitting device of claim 1, wherein the protective insulative member protrudes upward from the second region.

3. The light emitting device of claim 1, wherein the protective insulative member has a thickness of 2 μm to 10 μm.

4. The light emitting device of claim 1, wherein the protective insulative member includes at least one selected from the group consisting of $SiO_2$, $Si_xO_y$, $Si_3N_4$, $Si_xN_y$, $SiO_xN_y$, $Al_2O_3$, $TiO_2$, ITO, AZO and ZnO.

5. The light emitting device of claim 1, wherein the support electrode includes at least one selected from the group consisting of Ti, Cr, Ni, Al, Pt, Au, W, Cu, Mo, CuW and a semiconductor substrate doped with impurities.

6. The light emitting device of claim 1, further comprising an ohmic layer between the reflective layer and the light emitting structure.

7. The light emitting device of claim 6, wherein the ohmic layer includes at least one selected from the group consisting of ITO, Ni, Pt, Ir, Rh and Ag.

8. The light emitting device of claim 6, wherein the reflective layer includes at least one selected from the group consisting of Ag, Al, Pt, Pd and Cu.

9. The light emitting device of claim 1, wherein the support electrode includes a conductive support member and a bonding layer over the conductive support member.

10. The light emitting device of claim 9, wherein the bonding layer includes at least one selected from the group consisting of Ti, Au, Sn, Ni, Cr, Ga, In, Bi, Cu, Ag and Ta.

11. The light emitting device of claim 1, wherein the inner surface of the protective insulative member is inclined.

12. The light emitting device of claim 10, wherein the first region of the bonding layer has a thickness greater than a thickness of the second region of the bonding layer.

13. The light emitting device of claim 1, further comprising a current blocking layer between the light emitting structure and the reflective layer.

14. A light emitting device comprising:
a conductive support member;
a reflective layer over a first region of the conductive support member;

a protective insulative member over a second region of the conductive support member, which is positioned around the first region;

a light emitting structure located over the reflective layer and the protective insulative member, the light emitting structure including a first conductive semiconductor layer, a second conductive semiconductor layer, and an active layer interposed between the first and second conductive semiconductor layers, wherein a thickness of the protective insulative member is at least two times thicker than a thickness ranging from the active layer to the protective insulative member, and wherein the protective insulative member has an inner surface and an outer surface, the distance between the inner and outer surface defining a width of the protective insulative member and the width increases from the bottom of the protective insulative member to the top of the protective insulative member.

15. The light emitting device of claim 14, wherein the thickness of the protective insulative member is 2 μm to 10 μm.

16. The light emitting device of claim 14, wherein the first region of the conductive support member is thicker than the second region of the conductive support member and the protective insulative member protrudes upward from the second region.

17. The light emitting device of claim 14, wherein the conductive support member is formed at a lateral side thereof with a curved surface.

18. The light emitting device of claim 14, wherein the protective insulative member includes at least one selected from the group consisting of $SiO_2$, $Si_xO_y$, $Si_3N_4$, $Si_xN_y$, $SiO_xN_y$, $Al_2O_3$, $TiO_2$, ITO, AZO and ZnO.

19. The light emitting device of claim 14, wherein the inner surface of the protective insulative member is inclined inwardly when moving in a vertical direction from bottom to top.

20. The light emitting device of claim 1, wherein the inner surface of the protective insulative member is inclined inwardly when moving in a vertical direction from bottom to top.

* * * * *